United States Patent
Iwanaga

(10) Patent No.: US 6,816,239 B2
(45) Date of Patent: Nov. 9, 2004

(54) EXPOSURE APPARATUS, METHOD OF CONTROLLING SAME, AND METHOD OF MANUFACTURING DEVICES

(75) Inventor: Takehiko Iwanaga, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/235,646

(22) Filed: Sep. 6, 2002

(65) Prior Publication Data

US 2003/0048425 A1 Mar. 13, 2003

(30) Foreign Application Priority Data

Sep. 12, 2001 (JP) .......................... 2001-276745

(51) Int. Cl.⁷ ...................... G03B 27/58; G03B 27/62
(52) U.S. Cl. .................................. 355/72; 355/75
(58) Field of Search ..................... 355/53, 55, 72, 355/75

(56) References Cited

U.S. PATENT DOCUMENTS

| 5,008,705 | A | * | 4/1991 | Sindledecker | 355/43 |
|---|---|---|---|---|---|
| 5,063,576 | A | * | 11/1991 | Eguchi et al. | 375/362 |
| 5,347,118 | A | | 9/1994 | Iwanaga | 250/205 |
| 5,920,398 | A | | 7/1999 | Iwanaga et al. | 356/401 |
| 6,396,562 | B1 | | 5/2002 | Iwanaga | 355/30 |
| 2001/0019111 | A1 | | 9/2001 | Yamada et al. | 250/548 |
| 2001/0020687 | A1 | | 9/2001 | Yamada et al. | 250/548 |
| 2002/0085757 | A1 | | 7/2002 | Yamada et al. | 382/181 |

FOREIGN PATENT DOCUMENTS

| JP | 3-157822 | 7/1991 |
|---|---|---|
| JP | 10-47915 | 2/1998 |

* cited by examiner

Primary Examiner—Rodney Fuller
(74) Attorney, Agent, or Firm—Fitzpatrick, Cella, Harper & Scinto

(57) ABSTRACT

An exposure apparatus includes a stage which moves with an object thereon. A surface position detector is arranged to detect a surface position of the object at a timing that is asynchronous to a reference signal, and is provided for controlling the stage.

33 Claims, 13 Drawing Sheets

4

F I G. 10
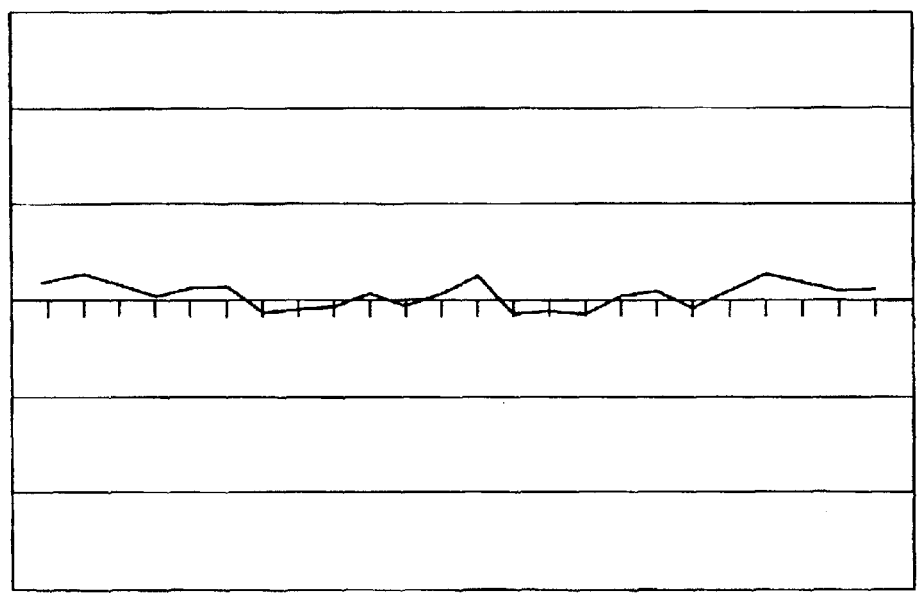

EXPOSURE APPARATUS, METHOD OF CONTROLLING SAME, AND METHOD OF MANUFACTURING DEVICES

FIELD OF THE INVENTION

This invention relates to an exposure apparatus, a method of controlling the apparatus and a method of manufacturing devices by utilizing the apparatus.

BACKGROUND OF THE INVENTION

There is a tendency for modern memory chips to be manufactured in increasingly larger sizes. For example, in first-generation 256M DRAMs, the reported size of the memory chip is 14×25 mm. This means that the speed at which memory capacity increases is greater than the speed at which the resolution line width and cell size of the exposure apparatus is reduced.

Generally, in the case of a memory chip size of 256M and beyond, only one chip can be exposed per exposure in an exposure area having a diameter of 31 mm in a demagnifying projection exposure apparatus (stepper) used as an exposure apparatus for the critical layer. In order to raise throughput, therefore, an exposure apparatus having a larger exposure area is required.

A semiconductor-element exposure apparatus for the rough layer and a reflecting projection exposure apparatus for large screen liquid crystal displays such as monitors, which require a high throughput, are used widely as an exposure apparatus for exposing a large exposure area. These apparatuses are of the slit-scan exposure type, which rely upon so-called mask-wafer relative scanning, for linearly scanning a mask with illuminating light in the shape of an arcuate slit and exposing a wafer to the mask in one batch using a concentric reflecting-mirror optical system.

With exposure apparatuses of this type, measurement of height of the wafer and drive for correcting automatic focusing and an automatic leveling mechanism are carried out continuously during scanning exposure. This is to gradually match the exposure surface of a photosensitive substrate (a wafer or glass plate coated with a photoresist, or the like) with the optimum image-forming plane of the projection optical system.

In the height and surface position detection mechanism of these exposure apparatuses, a method employed is to sense reflected light from the photosensitive substrate as a positional deviation on a CCD or PSD sensor using a so-called oblique-incidence optical system in which light is made to impinge upon a wafer surface from above at an angle. With a method of this kind, height is measured at a plurality of measurement positions during scanning, and the amount of drive for correcting the height and inclination of the wafer surface at such a time that the measurement position passes the exposure slit area is calculated and corrected based upon a plurality of measured values of height of the wafer surface.

In a case wherein only the exposure system of a currently available slit-scan exposure apparatus is improved in order to obtain a resolution capable of supporting DRAMs of 256M and beyond, a problem which arises is that the effects of measurement error and a difference in level with a chip can no longer be ignored.

Specifically, as the demagnifying projection system is provided with a higher NA so as to be capable of supporting finer circuit patterns, the allowed depth of focus of the circuit pattern in the transfer step becomes progressively smaller. In order to assure an allowed depth of more than 5 $\mu$m in a state-of-the-art exposure apparatus used in rough processes, it is possible to ignore the effects of measurement error and a difference in level within a chip, which are contained in measured values obtained by continuous measurement during scanning exposure.

However, when consideration is given to dealing with DRAMs from 256M onward, the allowed depth thereof is less than 1 $\mu$m and, hence, the effects of measurement error and a difference in level within a chip, which are contained in the measured values, cannot be neglected. In other words, in a case wherein the height and inclination of a wafer surface are measured and focus is corrected so as to hold the wafer surface within the allowed depth, the fact that the wafer surface has unevenness that is dependent upon the pattern makes it essential that an offset correction conforming to the wafer surface unevenness be applied in order to make the overall chip or shot agree with the image plane at all times when scanning exposure is carried out.

In this case, an accurate offset correction amount must be carried out unless the focus measurement point (the point at which height and inclination are measured for the purpose of focus correction) of each of the shots agree at the time of offset measurement. Though this is assured with a stepper in which motion is halted and measurement performed shot by shot, it is not assured with a scanning exposure apparatus (scanner). In particular, in a case wherein a storage-type sensor is used, the offset correction is inaccurate because of a deviation between the focus measurement point and the offset measurement point. In order to deal with this problem, Japanese Patent Application Laid-Open No. 10-47915, for example, discloses resetting the storage-start timing when the position of the wafer and that of the surface position detector becomes a predetermined relative amount.

However, even the invention disclosed in Japanese Patent Application Laid-Open No. 10-47915 cannot solve the aforesaid problem completely. This is because the wafer-position control system is a digital control system, so that the position of the wafer stage and the control cycle of the wafer control system are not maintained in a predetermined relationship. That is, even when it is attempted to measure height (surface position) at the same location in the wafer plane using the same wafer-stage driving profile, the measured location actually differs each time. More specifically, the measurement position may deviate by the amount of sampling jitter, i.e., by $$Ts \times Vs$$

where Ts represents the control cycle of the wafer stage control system and Vs represents the traveling velocity of the wafer stage. This deviation causes a deviation of position between the position of pattern offset measurement and the position of surface measurement prevailing at the time of exposure. As a result, a defocused pattern is transferred to the wafer. It will be understood from the above expression that jitter increases when the velocity of the wafer stage increases. In particular, because the velocity of the wafer stage has been increased to achieve higher throughput lately, the influence of jitter upon focusing precision has not been negligible.

Thus, as circuit patterns shrink, the focus measurement point and offset measurement point must be made to agree with a high degree of precision.

SUMMARY OF THE INVENTION

Accordingly, an object of the present invention is to provide an exposure apparatus and a method of controlling the same, whereby the focus measurement point and the offset measurement point can be made to agree with a high degree of precision.

According to a first aspect of the present invention, the foregoing object is attained by providing an exposure apparatus comprising: a stage moving with an object thereon; and a surface position detector arranged to detect surface position of the object at a timing that is asynchronous to a reference signal, which is for controlling the stage.

In accordance with a preferred embodiment of the present invention, the exposure apparatus further comprises a wafer position control system arranged to control the position of the stage.

In accordance with a preferred embodiment of the present invention, the position control system controls the position of the stage along the horizontal direction.

In accordance with a preferred embodiment of the present invention, the surface position detector includes a light source, light from said light source impinging upon the surface of the object; and a storage-type sensor arranged to receive reflected light from the surface of the object; wherein the height and inclination of the surface of the object are detected based upon an output signal from the storage-type sensor.

In accordance with a preferred embodiment of the present invention, the exposure apparatus further comprises a horizontal position detector arranged to detect the horizontal position of the object on the moving stage, and providing timing of a detection operation performed by the surface position detector.

In accordance with a preferred embodiment of the present invention, the horizontal position detector includes an interferometer.

In accordance with a preferred embodiment of the present invention, the exposure apparatus further comprises a horizontal position calculation unit arranged to calculate the horizontal position of the object on the moving stage, and providing timing of a detection operation performed by the surface position detector.

In accordance with a preferred embodiment of the present invention, the horizontal position calculation unit calculates the horizontal position of the object on the moving stage by measuring time.

In accordance with a preferred embodiment of the present invention, the exposure apparatus further comprises a controller arranged to control the surface position detector so that the surface position detector detects the surface position of the object, while the stage is being moved, prior to an exposure operation, and controlling the exposure operation based upon a result of detection of the surface position.

In accordance with a preferred embodiment of the present invention, the exposure apparatus further comprises a calculation unit arranged to control the surface position detector so that said surface position detector detects the surface position of the object, while the stage is being moved, prior to an exposure operation, and calculating focus correction data based upon a result of the detection of the surface position; and a focus controller arranged to control the surface position detector so that said surface position detector detects the surface position of the object, while the stage is being moved, when exposure is performed, and applying a focus correction based upon a result of the detection of the surface position and the focus correction data.

In accordance with a preferred embodiment of the present invention, the exposure apparatus operates as a scanning exposure apparatus.

According to a second aspect of the present invention, the foregoing object is attained by providing a method of controlling an exposure apparatus, comprising a surface position detecting step of detecting surface position of an object, which has been placed on a stage so as to be moved thereby, at a timing that is asynchronous to a reference signal, which is for controlling the stage.

In accordance with a preferred embodiment of the present invention, the step of detecting surface position of an object includes the steps of: impinging light upon the surface of the object; receiving reflected light from the surface of the object by using a storage-type sensor; and detecting height and inclination of the surface of the object based upon an output signal from the storage-type sensor.

In accordance with a preferred embodiment of the present invention, the method further comprises a horizontal position detecting step of detecting the horizontal position of the object on the moving stage and providing timing of a detection operation performed at the surface position detecting step.

In accordance with a preferred embodiment of the present invention, the horizontal position of the object on the moving stage is detected utilizing an interferometer at the horizontal position detecting step.

In accordance with a preferred embodiment of the present invention, the method further comprises a horizontal position calculating step of calculating the horizontal position of the object on the moving stage and providing timing of a detection operation performed at the surface position detecting step.

In accordance with a preferred embodiment of the present invention, the horizontal position calculating step includes a step of calculating the horizontal position of the object on the moving stage by measuring time.

In accordance with a preferred embodiment of the present invention, the method further comprises a control step of executing the surface position detecting step, while the stage is being moved, prior to an exposure operation, and controlling the exposure operation based upon a result of the detection of the surface position.

In accordance with a preferred embodiment of the present invention, the method further comprises a calculating step of executing the surface position detecting step, while the stage is being moved, prior to an exposure operation, and calculating focus correction data based upon a result of the detection of the surface position; and a focus step of executing the surface position detecting step, while the stage is being moved, when exposure is performed, and applying a focus correction based upon a result of the detection of the surface position and the focus correction data.

In accordance with a preferred embodiment of the present invention, the exposure apparatus is a scanning exposure apparatus.

According to a third aspect of the present invention, the foregoing object is attained by providing a device manufacturing method comprising a coating step of coating an object with a photosensitive material; an exposure step of printing a pattern on the object, which has been coated with the photosensitive material, utilizing the exposure apparatus described above; and a developing step of developing the object on which the pattern has been printed.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 10 is a diagram illustrating variation of a measured value of surface position at the time of offset measurement and at the time of exposure measurement owing to sampling jitter;

DESCRIPTION OF THE PREFERRED EMBODIMENT

A preferred embodiment of the present invention will now be described with reference to the accompanying drawings.

Figure 1:
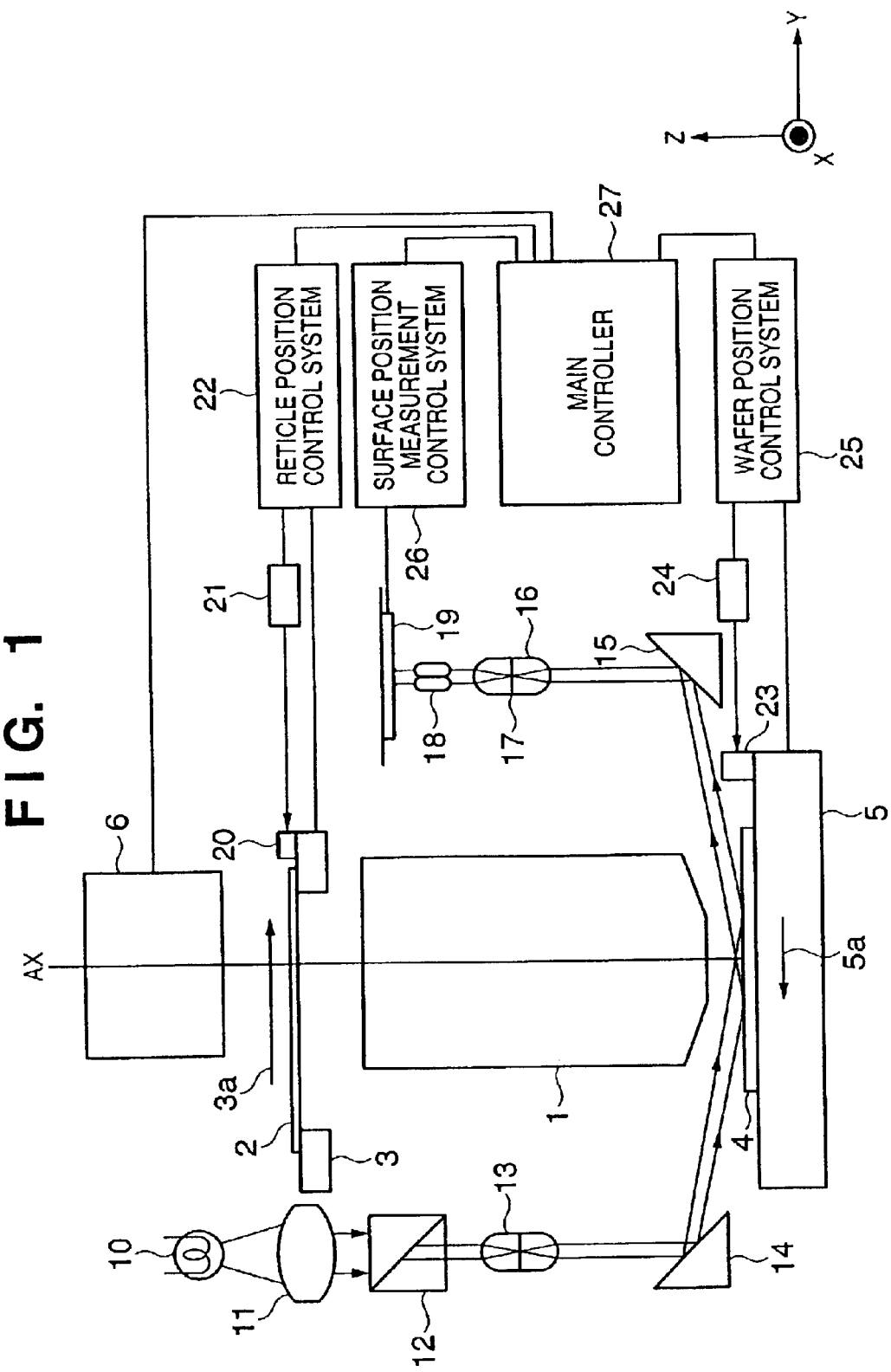
FIG. 1 is a partial schematic view illustrating a slit-scan projection exposure apparatus that employs a surface position detecting method according to a preferred embodiment of the present invention.

FIG. 1 is a partial schematic view illustrating a slit-scan projection exposure apparatus that employs a surface position detecting method according to a preferred embodiment of the present invention. As shown in FIG. 1, a demagnifying projection lens 1, which has an optical axis AX, has its image plane situated perpendicular to the Z axis in FIG. 1. A reticle 2 is held on a reticle stage 3. The reticle 2 has a pattern that is demagnified and projected by the demagnifying projection lens 1 (at a magnification of, e.g., ¼ or ½) in such a manner that the image of the reticle pattern is formed on the image plane. A wafer 4, which is an object that is to undergo exposure, has its surface coated with a resist. A number of exposure areas (shots), which have been formed by an earlier exposure step, are arrayed on the surface of the wafer. The wafer 4 is placed on a wafer stage 5. The wafer stage 5 includes a chuck that secures the wafer 4, an XY stage capable of being moved horizontally along the directions of the X and Y axes, a leveling stage capable of being moved along the Z axis, which is the direction of the optical axis of the projection lens 1, and of being rotated about an axis that is parallel to the Y axis, and a rotating stage capable of being rotated about an axis that is parallel to the Z axis. This constructs an axis correction system for bringing the image of the reticle pattern into agreement with the exposure areas on the wafer 4.

Elements 10 to 19 in FIG. 1 construct a surface position detecting system provided in order to detect the surface position and inclination of the wafer 4. Elements 10 to 14 on the side on which light impinges upon the wafer 4 will be described first.

A light source 10 emits light by a white-light lamp or high-luminescence light-emitting diode having a plurality of peak wavelengths of different phases. A collimator lens 11 emits the light from the light source 10 as parallel light whose cross-sectional intensity distribution is substantially uniform. An optical member 12 comprises a pair of prisms whose diagonal faces are affixed to each other. A light-shielding film, such as chrome having a plurality of apertures (e.g., seven pinholes) through which light is allowed to pass, is provided at the opposing diagonal surfaces of the prisms. A lens system 13, which constitutes a double telecentric system, introduces seven independent beams of light, which have passed through the seven pinholes of the optical member 12, to seven measurement points on the wafer 4 via a mirror 14. Though only two of these light beams are depicted in FIG. 1 in order to simplify the drawing, in actuality, each illustrated light beam comprises three parallel light beams that are perpendicular to the plane of the drawing, and one more light beam (the one not shown in FIG. 1) is disposed between the two illustrated light beams. The plane in which the pinholes are formed and the plane that contains the surface of the wafer 4 satisfy Scheimpflug's condition with respect to the lens system 13.

Figure 2:
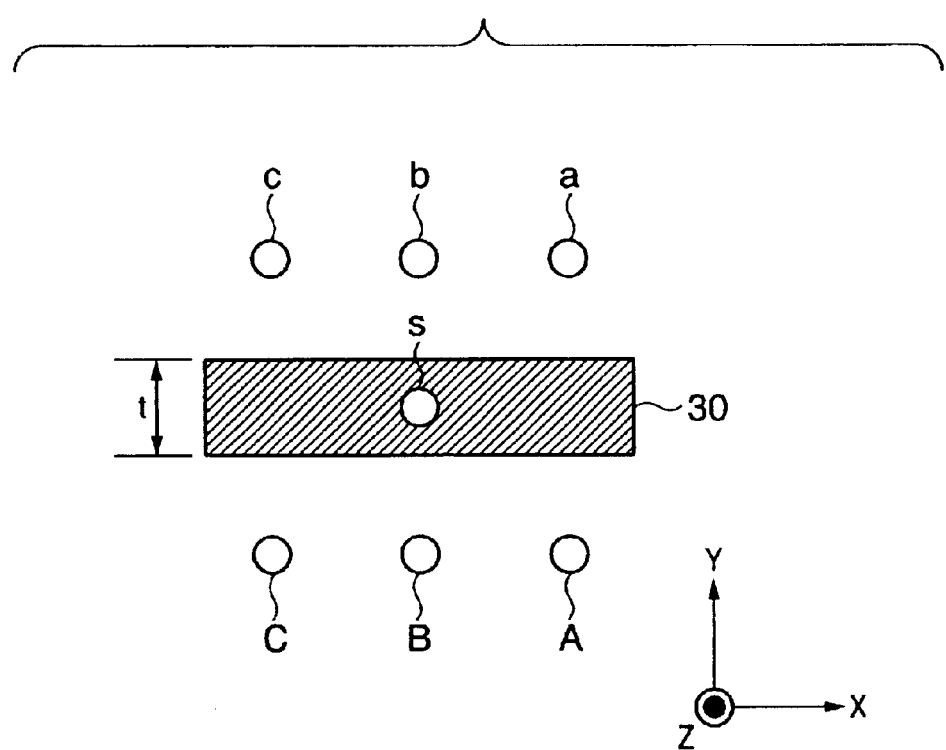
FIG. 2 is a diagram useful in describing the positional relationship between an exposure slit and spots in the apparatus of FIG. 1.
Figure 3:
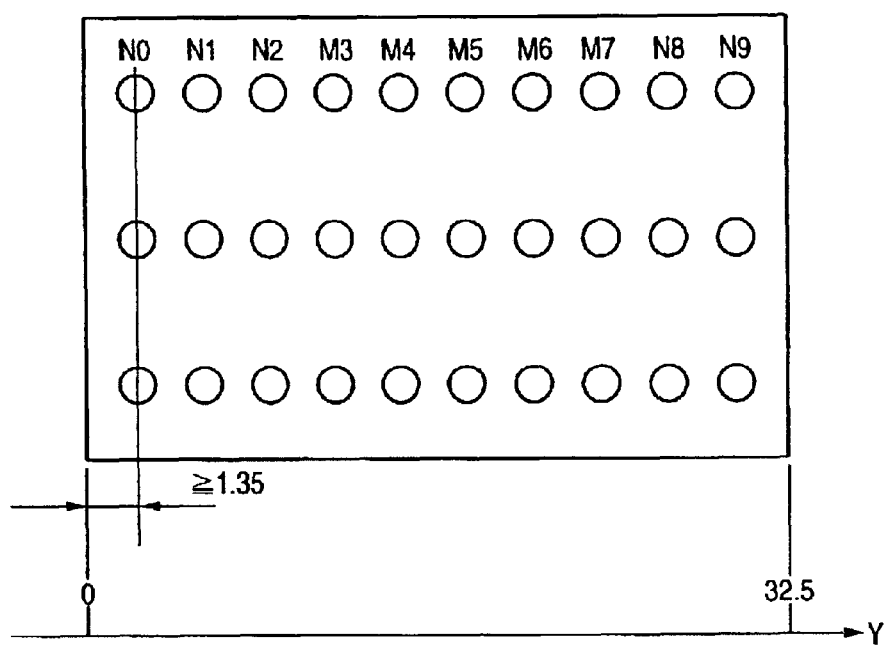
FIG. 3 is an explanatory view illustrating measurement spots on a wafer chip shown in FIG. 1.

FIG. 2 illustrates the positional relationship between a slit (exposure slit) 30 projected upon the wafer 4 by the demagnifying projection lens 1 and the seven measurement points (spots) on the wafer 4, and FIG. 3 illustrates focus measurement points on the wafer. In FIG. 2, the size of the exposure slit 30 is 7×25 mm and the size of the exposure area (maximum shot dimensions) is, e.g., 25×32.5 mm. A total of seven spots (S, A, B, C, a, b, c) have been set as the measurement spots, namely, one at the center of the exposure slit 30 and three each on either side of the exposure slit 30 at positions spaced away from the center by 12 mm in the scanning direction. Wafer height (position along the Z axis) is measured, spot by spot, at ten points (M0 to M9) along the wafer measurement direction using the three channels of spots A, B, C when the wafer 4 is scanned from the bottom up (UP scanning) in FIG. 2 and the three channels of spots a, b, c when the wafer 4 is scanned from the top down (DOWN scanning) in FIG. 2. The data obtained by measurement is used as data for a focus correction executed when the wafer is subsequently moved further and each measurement point arrives at the center of the exposure slit 30. In other words, the focus correction is carried out after the surface position at each measurement point is measured in advance (this is referred to as pre-read measurement). The spot S is for slit acquisition measurement.

Figure 4:
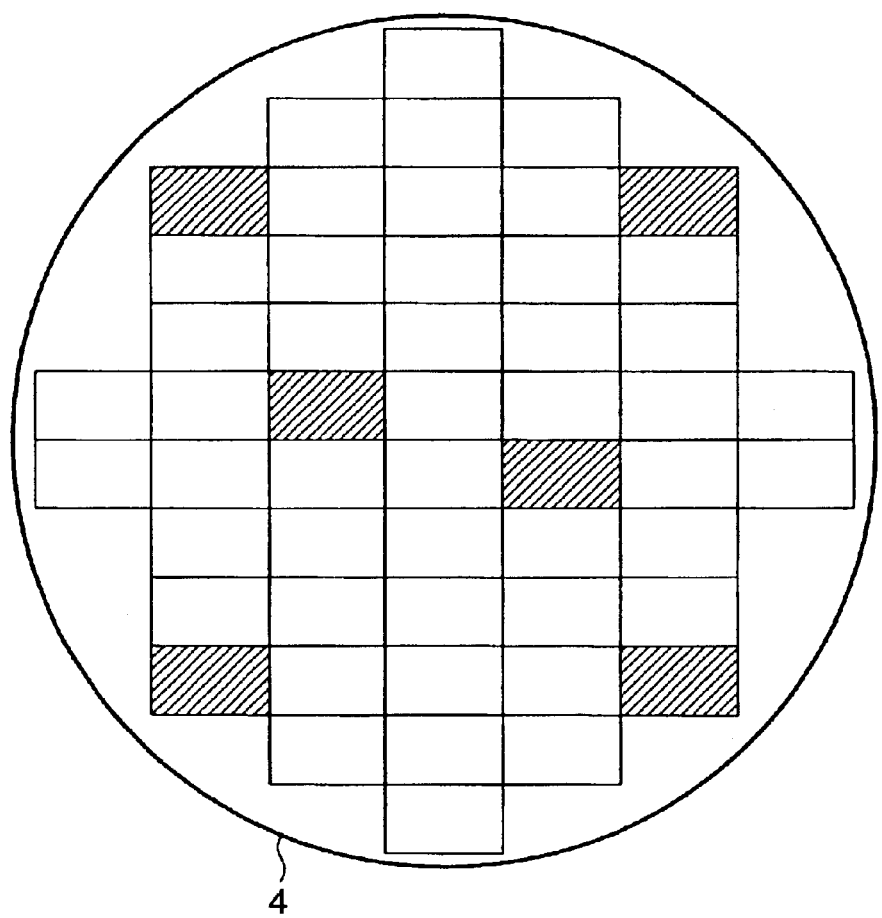
FIG. 4 is a plan view illustrating an array of exposure areas on a wafer and an example of a selection of sample shots for performing prescanning according to this embodiment.

An angle of incidence φ (with respect to the perpendicular to the wafer surface, i.e., with respect to the optical axis) when each light beam of the light emission section (elements 10 to 14) in FIG. 1 impinges upon the wafer 4 satisfies the relation φ=70°. A plurality of pattern areas (exposure-area shots) are arrayed on the wafer 4, as illustrated in FIG. 4.

The seven light beams that have passed through the lens system 13 impinge and form images on the mutually independent measurement points of the pattern areas, as illustrated in FIG. 2. Further, the light beams impinge from a direction rotated from the Y direction (scanning direction) by $\Theta°$ (e.g., 22.5°) in the XY plane in such a manner that the seven measurement points may be observed independently of one another on the surface of the wafer 4. As a result, an appropriate spatial arrangement of the elements is obtained, as proposed in Japanese Patent Application No. 3-157822, thereby facilitating highly precise detection of surface position.

Next, the detection section composed of elements 15 to 19 on the side on which reflected light from the wafer 4 is detected will be described.

A photoreceptor lens 16, which constitutes a double telecentric system, receives seven reflected light beams from the surface of wafer 4 via a mirror 15. A stopper diaphragm 17 disposed in the photoreceptor lens 16 is provided as a common diaphragm for each of the seven measurement points and blocks higher order diffracted light (noise light) generated by the circuit pattern present on the wafer 4. The optical axes of the light beams that have passed through the photoreceptor lens 16 of the double telecentric system are parallel to one another. Owing to seven individual correction lenses in a correction optical system group 18, the images of these light beams are formed again on the detection surface of an optoelectric transducer group 19 in such a manner that light spots of the same size are obtained. Further, because the detection section (elements 16 to 18) performs a tilt correction in such a manner that each measurement point on the wafer 4 and the detection surface of the optoelectric transducer group 19 become the conjugate of each other, the positions of the pinhole images on the detection surface are not changed by local inclination of each measurement point, but the pinhole images change upon detection in response to a change in height of each measurement point along the direction of the optical axis AX.

Accordingly, the optoelectric transducer group 19 is constructed from seven one-dimensional CCD line sensors. Such a construction is more advantageous than the conventional arrangement, which uses a single two-dimensional sensor, for the following reasons: First, in terms of constructing the correction optical system group 18, separating the optoelectric transducers increases the degree of freedom with regard to placement of the optical members and the holders that retain them. Further, the optical members can be assembled together more compactly if the light is made to impinge upon the individual sensors by splitting the optical path after enlarging optical magnification from the mirror 15 to the correction optical system group 18 in order to improve detection resolution. Furthermore, with a slit scanning scheme, continuous measurement of focus during exposure is essential, and therefore shortening measurement time becomes an issue. In the case of the conventional two-dimensional CCD sensor, however, a read-out time that is ten times greater than that of a one-dimensional sensor is required. One contributing factor is that, conventionally, more data than necessary is read out.

A slit-scan exposure system according to a preferred embodiment of the present invention will now be described.

After the reticle 2 is drawn to and fixed to the reticle stage 3 by suction, the reticle 2 is scanned at a constant speed along the Y axis in a plane perpendicular to the optical axis AX of the projection lens 1, as shown in FIG. 1, and the reticle is subjected to corrective drive along the X axis (the direction perpendicular to the plane of the drawing) in such a manner that a target coordinate position is scanned at all times. Positional information concerning the reticle stage 3 along the X and Y directions is measured constantly by an XY mirror 20, which is secured to the reticle stage 3, and a plurality of laser beams emitted from a reticle interferometer (XY) 21.

An exposure illumination optical system 6, which comprises a light source such as an excimer laser for generating pulsed light, a beam shaping optical system, an optical integrator, a collimator and a masking blade mirror, etc., is formed from a material that effectively transmits or reflects pulsed light in the far ultraviolet region. The beam shaping optical system is for shaping the cross section (inclusive of dimensions) of the incident beam into a desired shape. The optical integrator is for uniformalizing the alignment characteristic of the light beam so that the reticle 2 will be illuminated with uniform brightness. The exposure slit 30 (FIG. 2) is decided in accordance with chip size by the masking blade (not shown) in the exposure illumination optical system 6, and the pattern on the reticle 2 partially illuminated by the exposure slit 30 is projected via the projection lens 1 onto the wafer 4 coated with the resist.

A main controller 27 shown in FIG. 1 controls the overall system in such a manner that the slit image of the reticle 2 will subject a predetermined area of the wafer 4 to scanning exposure while position in the XY plane (X, Y positions and angle $\Theta$ of rotation about an axis parallel to the Z axis) and position along the Z axis (angles $\alpha$, $\beta$ of rotation about axes parallel to the X, Y axes, and height Z along the Z axis) is adjusted. In other words, positioning of the reticle pattern in the XY plane is implemented by calculating control data from position data obtained by reticle interferometer 21 and wafer-stage interferometer 24 and wafer-position data obtained from an alignment microscope (not shown), and controlling a reticle position control system 22 and wafer position control system 25.

In a case wherein the reticle stage 3 is scanned in the direction of arrow 3a in FIG. 1, the wafer stage 5 is scanned in the direction of arrow 5a in FIG. 1 at a speed corrected by the amount of demagnification performed by the projection lens 1. The scanning speed of the reticle stage 3 is decided, so as to obtain an advantageous throughput, based upon the width of the masking blade (not shown) in the scanning direction and the sensitivity of the resist with which the surface of the wafer 4 has been coated.

The positioning of the pattern of reticle 2 along the direction of the Z axis, namely, the positioning of the pattern on the image plane, is carried out by the wafer position control system 25, which controls the levelling stage of the wafer stage 5 based upon the result of calculation by a surface position measurement control system 26, which detects the height of the wafer 4 on the basis of an output from the optoelectric transducer group 19. More specifically, on the basis of height data obtained by utilizing light spots at three points for wafer height measurement disposed close to the front side of the exposure slit 30 relative to the scanning direction, inclination in a direction perpendicular to the scanning direction and height along the optical axis AX are calculated, the amount of correction to the optimum image-plane position at the exposure position is found and the correction is performed based upon this amount of correction.

Figure 5:
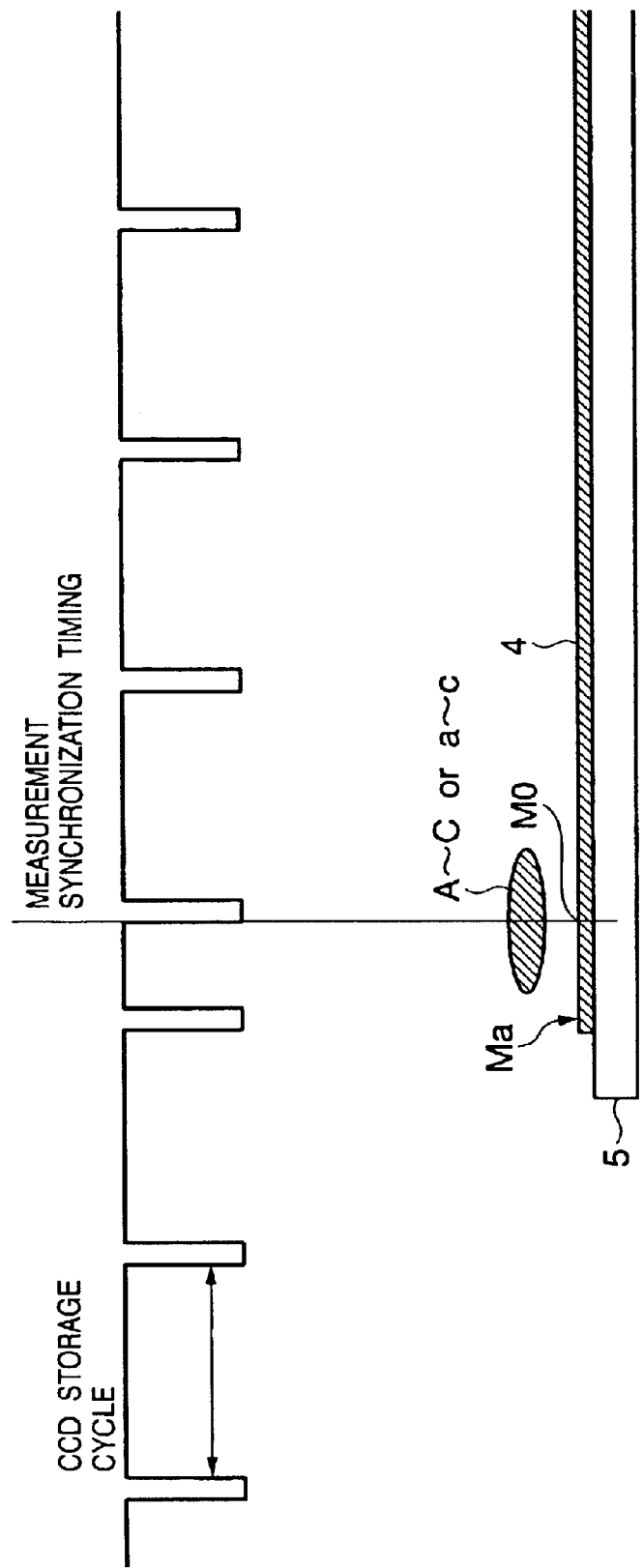
FIG. 5 is an explanatory view illustrating position of a wafer in FIG. 1 and the storage cycle of a CCD sensor.

In the apparatus of FIG. 1, the storage operation (i.e., detection operation) of the optoelectric transducer group 19 (CCD sensor) is controlled in accordance with accurate position information concerning the wafer stage 5. A command receiving method or hard-wired synchronizing method can be adopted as the method of obtaining accurate position information on the wafer stage 5. More specifically, at each shot, the wafer stage 5 is moved to the starting point Ma of the shot (the position at which focus measurement is possible) after the start of scanning, as shown in FIG. 5, and the fact that the initial focus measurement point M0 has arrived at the spots A to C or a to c can be detected based upon position data of wafer stage 5 output from the wafer-stage interferometer 24. The surface position of the focus measurement point M0 can be detected accurately by initializing the storage cycle of the optoelectric transducer group (CCD sensor) 19 based upon the above-mentioned detection of arrival at the spots A to C or a to c. Thus, the position of the wafer 4 and the timing of measurement by the optoelectric transducer group (CCD) 19 can be synchronized by initializing the CCD storage cycle using a measurement start as the trigger even during the course of the storage cycle. By virtue of such synchronization, measurement of surface position can be carried out at the same measurement point of the shot or chip at all times in any scan of exposure and offset measurement, and a highly precise focus correction can be performed by subjecting the measured value prevailing during scanning exposure to a highly accurate correction using an offset value measured at the same position.

Figure 9:
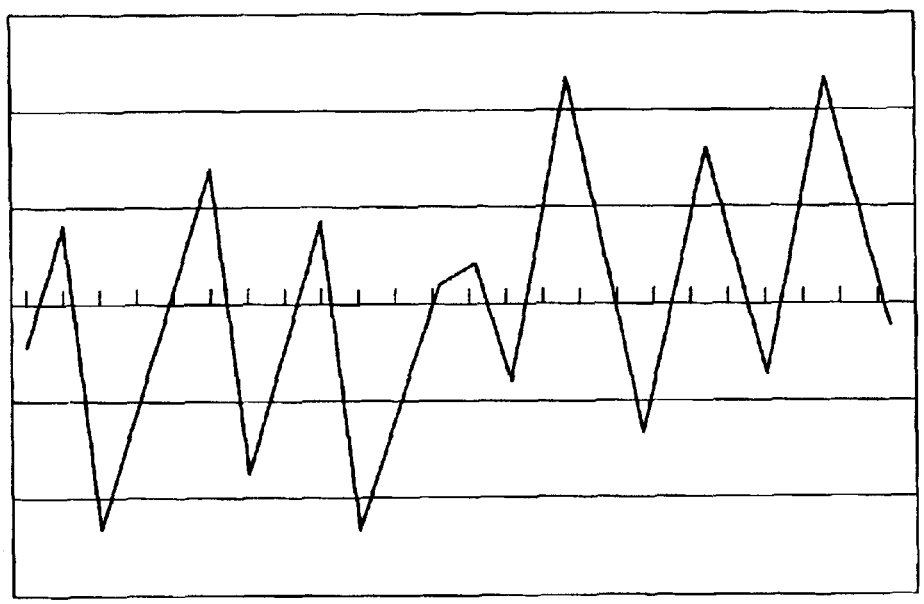
FIG. 9 is a diagram illustrating variation of a measured value of surface position at the time of offset measurement and at the time of exposure measurement owing to sampling jitter.

As pointed out earlier, the wafer position control system is a digital control system and, therefore, the position of the wafer stage and the cycle (control cycle) of the reference signal for controlling the wafer control system are not maintained in a fixed relationship accurately. In other words, even when it is attempted to measure the surface position of a wafer at the same location using the same wafer-stage driving profile, the location at which the surface position is measured differs each time if the present invention is not applied. That is, there is the possibility that the measurement position will deviate by the amount of sampling jitter, i.e., by $$Ts \times Vs$$

where Ts represents the control cycle of the wafer stage control system and Vs represents the traveling velocity of the wafer stage. FIG. 9 is a graph illustrating such jitter, in which the position of the wafer stage is plotted along the horizontal axis and the difference between the measured value of surface position at the time of offset measurement and at the time of exposure measurement is plotted along the vertical axis. Beats are produced at a specific period decided by the intervals at which surface position is measured and the control cycle of the wafer stage control system. It will be understood that this causes the focus correction operation to develop an error.

Figure 6:
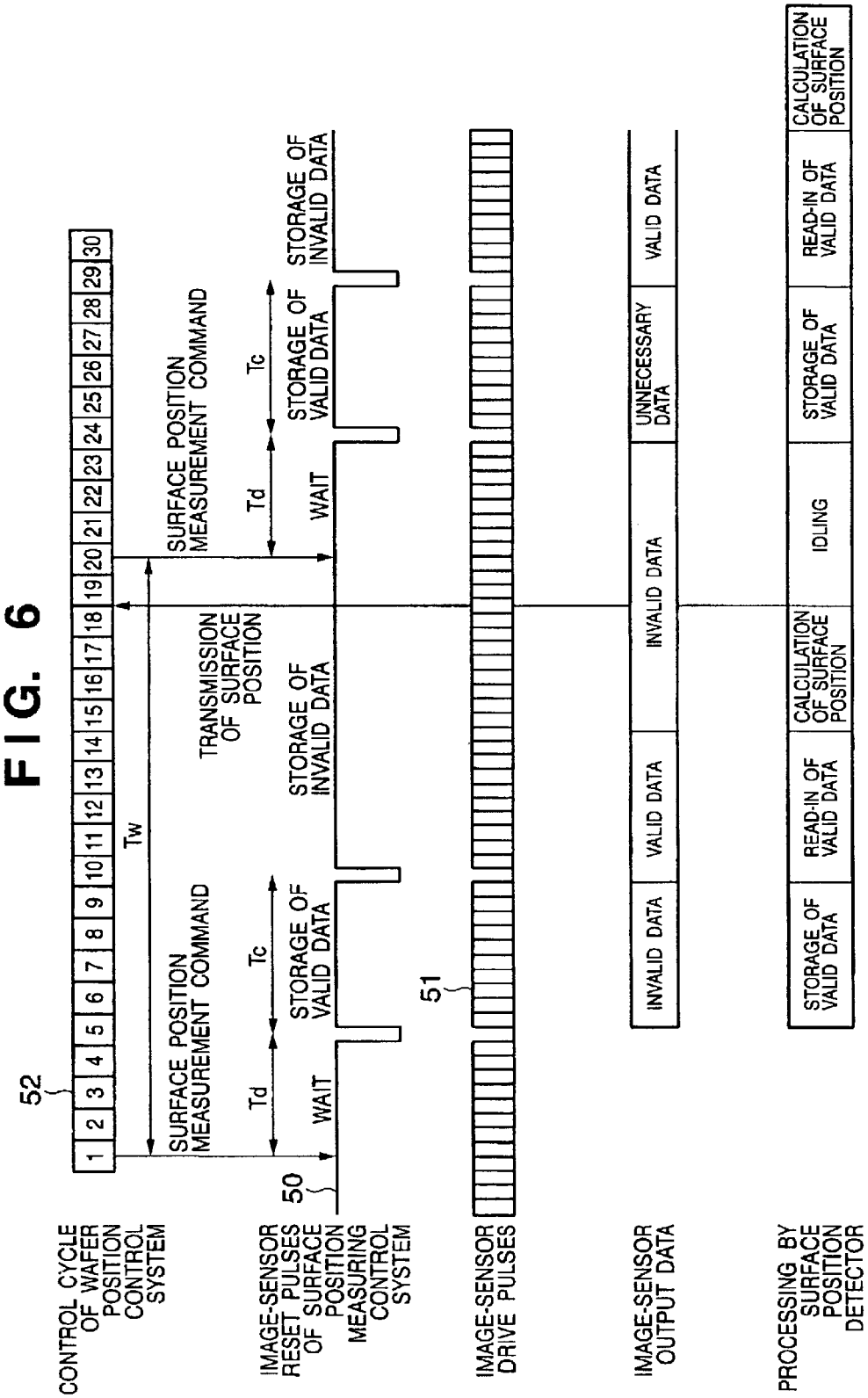
FIG. 6 is a diagram useful in describing the operating timings of a wafer control system and a surface position detecting system in a preferred embodiment of the present invention.

In order to eliminate jitter that arises from such digital sampling, this preferred embodiment of the invention is such that the surface position measurement control system 26 generates pulses, which reset the optoelectric transducer group 19, asynchronously with respect to the control cycle based upon the precise position of the wafer stage in the horizontal direction. FIG. 6 illustrates the phase relationship between a control cycle 52 of the wafer position control system 25 and image-sensor reset pulses 50 and drive pulses 51 generated by the surface position measurement control system 26. In the first control cycle, the wafer position control system 25 sends the surface position measurement control system 26 a command to the effect that measurement of surface position is to start when the wafer arrives at a first position in the horizontal direction. An ideal example of a method of sensing the horizontal position of the wafer by the surface position measurement control system 26 is to use a hardware mechanism that presets the position of the wafer stage and employs the wafer-stage interferometer 24 to detect arrival of the wafer stage at this wafer-stage position and to issue an output signal that indicates this. An alternative approach is to calculate a fixed time that conforms to the above-mentioned command by using a timer and taking the speed of the wafer stage into account. When the wafer arrives at the first horizontal position, the surface position measurement control system 26 stores an image for a period of time Tc decided by the sensitivity of the image sensor, and the surface position measurement system reads in the image data after the time Tc.

The surface position measurement control system 26 then continues to send only the image-sensor drive pulses without issuing reset pulses to the optoelectric transducer group (CCD sensor) 19. When the reading in of the image data ends, the surface position measurement control system 26 calculates the surface position from the data obtained and sends the result back to the wafer position control system 25. Next, the wafer position control system 25 sends the surface position measurement control system 26 a command to the effect that measurement of surface position is to be performed when the wafer arrives at a second position in the horizontal direction. Upon receiving this command, the surface position measurement control system 26 issues an image-sensor reset pulse by the above-described method when the wafer arrives at the second horizontal position. The above-described operation is repeated from this point onward. As a result, the position of the wafer surface can be measured with good reproducibility, based upon the precise position of the wafer stage 5 in the horizontal direction, without the system being constrained by the relationship between the position of the wafer stage 5 and the control cycle of the wafer position control system 25.

Figure 7:
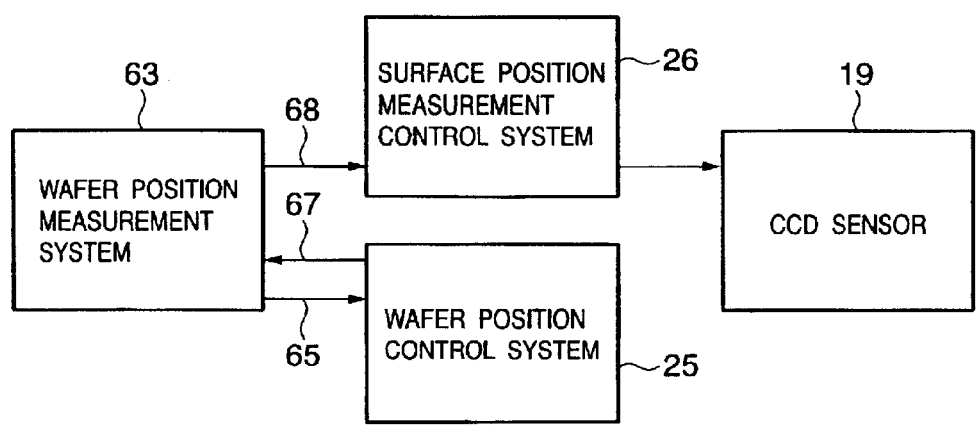
FIG. 7 is a block diagram of control according to this embodiment.

FIG. 7 is a block diagram illustrating a specific example of the configuration of a control system relating to the timing at which the position of the wafer surface is measured. In this example, a wafer position measurement system 63 constituted by the wafer-stage interferometer 24, etc., sends the surface position measurement control system 26 a command 68 indicative of image sensing timing (timing for detection of surface position). More specifically, this arrangement is such that in accordance with information 65 relating to wafer position provided by the wafer position measurement system 63 and a command received from the main controller 27 (not shown in FIG. 7), the wafer position control system 25 sends position information 67, which relates to the wafer position (in the horizontal direction) at which surface measurement is to be performed, to the wafer position measurement system 63. The latter presets the position information 67 in a preset counter of a comparator, or the like, and sends the surface-position measurement command 68 to the surface position measurement control system 26 when the position of the wafer in the horizontal direction arrives at the preset position. In accordance with the command 68, the surface position measurement control system 26 supplies the optoelectric transducer group (CCD sensor 19) with a reset pulse and drive pulses that follow the reset pulse. It should be noted that, in actuality, the wafer position control system 25 does not use the position information supplied by the wafer position measurement system 63 as the coordinate system of the wafer without change, but rather, calculates the wafer coordinates by performing a coordinate transformation or a scaling correction, etc. Therefore, when the stage position at which the surface position of the wafer is to be measured is preset in the preset counter, the wafer position at which surface measurement is to be performed is converted to the stage position to decide a preset value.

Figure 8:
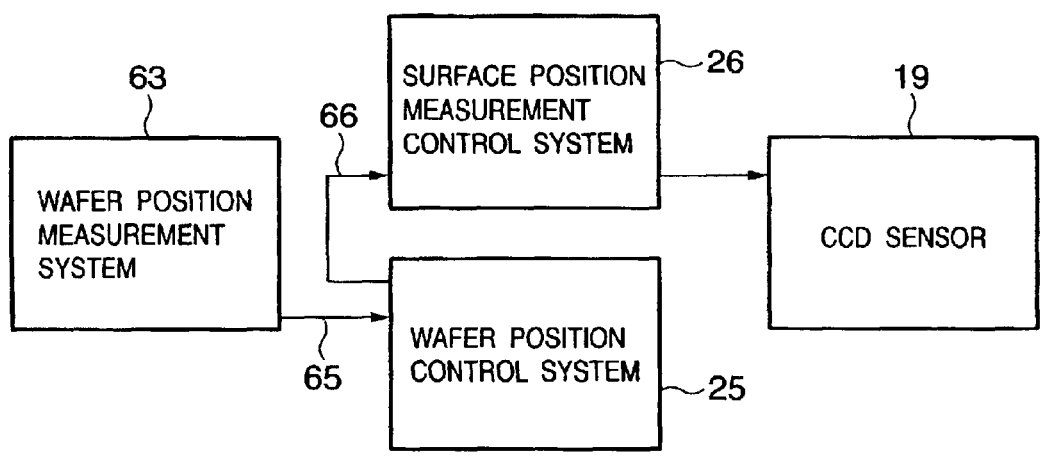
FIG. 8 is a block diagram of control according to this embodiment.

FIG. 8 is a block diagram illustrating another specific example of the configuration of a control system relating to the timing at which the position of the wafer surface is measured. In this example, the wafer position control system 25 sends a command 66 to measure the surface position of the wafer to the surface position measurement control system 26 in accordance with the information 65 relating to wafer position provided by the wafer position measurement system 63 and the command received from the main controller 27 (not shown in FIG. 7). The measurement command 66 contains position information representing the horizontal position of the wafer at which the position of the wafer surface is to be measured. After receiving the command 66, the surface position measurement control system 26 supplies the optoelectric transducer group (CCD sensor) 19 with a reset pulse and drive pulses that follow the reset pulse when the position of the wafer stage in the horizontal direction arrives at the position specified by the position information contained in the command 66. Here, the position information contained in the command 66 can be time information that corresponds to the position of the wafer stage (the position of the wafer). In this case, the wafer position control system 25 sends wafer-stage velocity information to the surface position measurement control system 26 beforehand. On the basis of the wafer-stage velocity information and the time information contained in the command 66, the surface position measurement control system 26 can calculate the position of the wafer in the horizontal direction accurately, recognizing that the position of the wafer stage in the horizontal direction has arrived at a measurement point and supply the optoelectric transducer group (CCD sensor) 19 with a reset pulse and drive pulses that follow the reset pulse.

FIG. 10 illustrates the difference between a measured value of surface position at the time of offset measurement and at the time of exposure measurement in a case wherein a measurement command is issued to the surface position measurement system asynchronously with respect to the stage control cycle based upon the precision position of the wafer stage 5 under conditions similar to those shown in FIG. 9.

Figure 11:
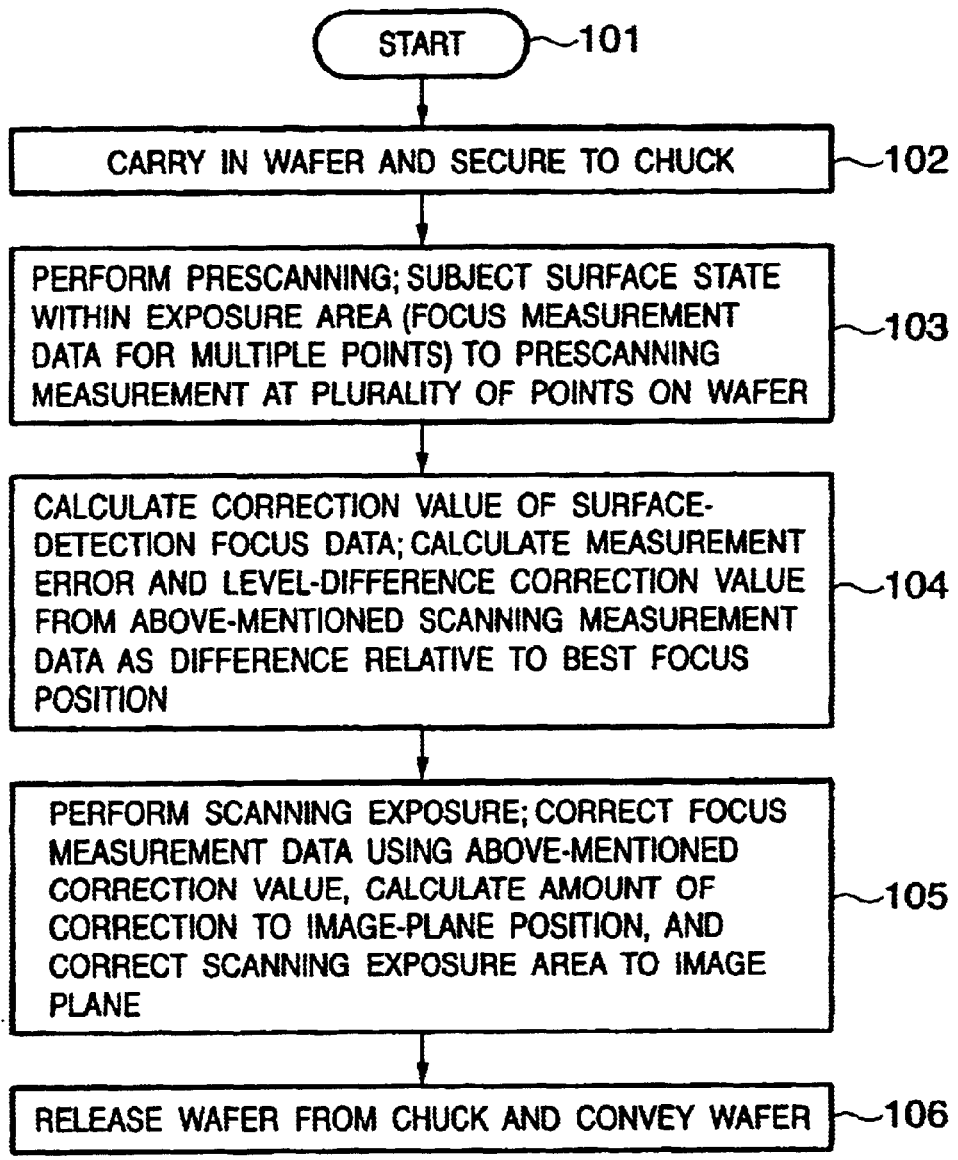
FIG. 11 is a flowchart illustrating a sequence from wafer carry-in to wafer carry-out in the apparatus shown in FIG. 1.

Reference will be had to the flowchart of FIG. 11 to describe an exposure method to which the method of detecting surface position according to a preferred embodiment of the invention is applied.

A start command is received at step 101 in FIG. 11, after which a wafer is carried in, placed on the wafer stage and secured to the chuck at step 102. In order to subsequently measure the surface shape in the exposure area of the chip (the surface position at a plurality of points), a prescanning measurement (detecting surface position at a plurality of locations in each exposure area while scanning is actually carried out) is performed at step 103 with regard to specific sample shot areas of the kind indicated by the hatching in FIG. 4. This is followed by step 104, at which the detected value of surface position is used to calculate a correction value for correcting the measured value prevailing during scanning exposure to the optimum position of the exposure image plane (i.e., a correction value for correcting error that is dependent upon the pattern structure). When calculation of the correction value is completed, a sequence for scanning exposure at each exposure position is executed at step 105. More specifically, the detected value of surface position at a measurement point for detecting each surface position is corrected by the above-mentioned correction value in conformity with the pattern structure at the measurement point, and calculation of a focus correction quantity and corrective drive are carried out in order to make the exposure area agree with the exposure image plane based upon the corrected value of detected surface position. When scanning exposure is completed for all shots, chuck suction that is being applied to the underside of the wafer is released at step 106 so that the wafer can be taken from the wafer stage and conveyed out. If there is a succeeding wafer to be processed after the above-mentioned wafer is conveyed out, control returns to step 101 and processing similar to that described above is repeated.

Figure 12:
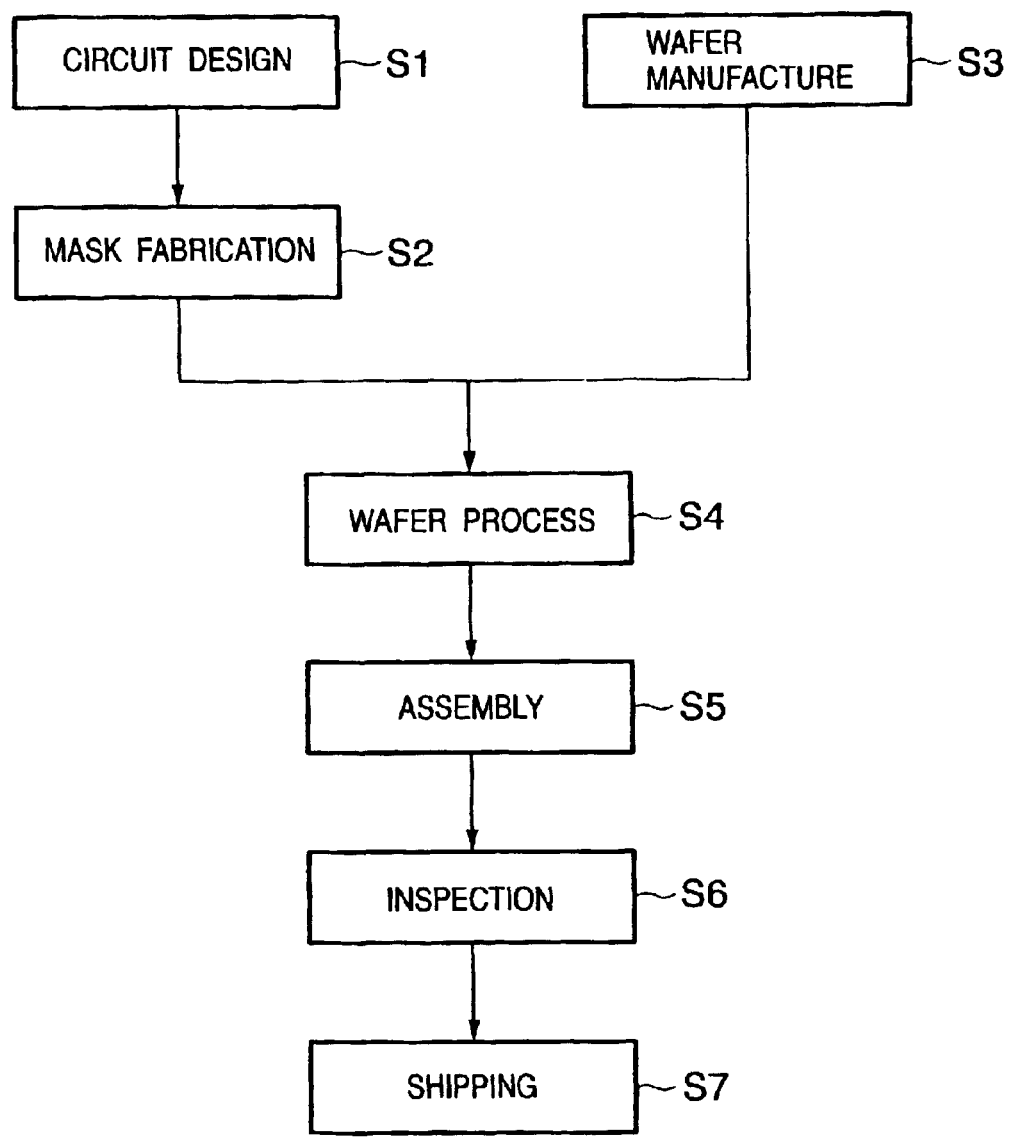
FIG. 12 is a diagram illustrating the overall flow of a process for manufacturing semiconductor devices.

A process for manufacturing a semiconductor device utilizing the exposure apparatus set forth above will now be described. FIG. 12 illustrates the overall flow of a process for manufacturing semiconductor devices. The circuit for the semiconductor device is designed at step 1 (circuit design). A mask is fabricated at step 2 (mask fabrication). Meanwhile, a wafer is manufactured using a material such as silicon at step 3 (wafer manufacture). The actual circuit is formed on the wafer by lithography, using the mask and wafer that have been prepared, at step 4 (wafer process), which is also referred to as "pre-treatment". A semiconductor chip is obtained, using the wafer fabricated at step 4, at step 5 (assembly), which is also referred to as "post-treatment". This step includes assembly steps such as actual assembly (dicing and bonding) and packaging (chip encapsulation). The semiconductor device fabricated at step 5 is subjected to inspections such as an operation verification test and a durability test at step 6 (inspection). The semiconductor device is completed through these steps and then is shipped (step 7).

Figure 13:
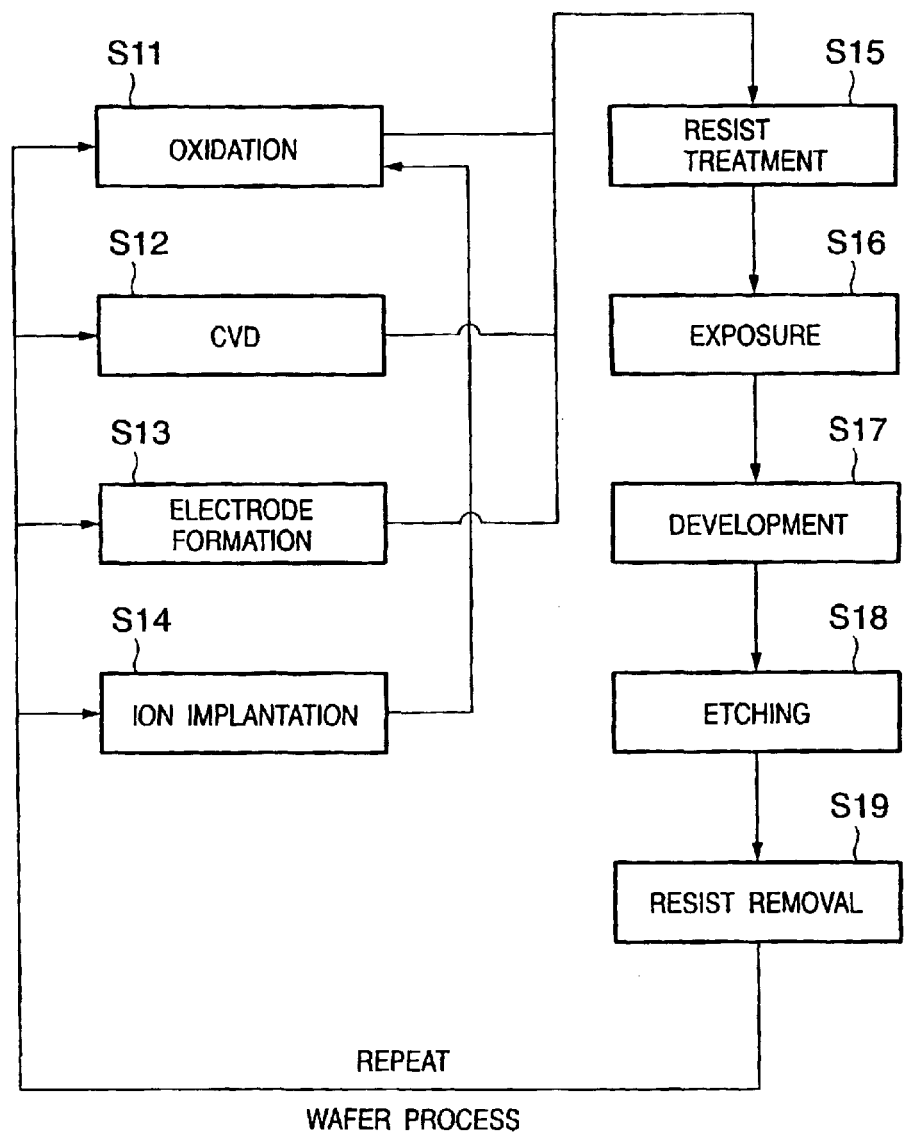
FIG. 13 is a diagram illustrating the detailed flow of a wafer process.

FIG. 13 is a flowchart illustrating the detailed flow of the wafer process mentioned above. The surface of the wafer is oxidized at step 11 (oxidation). An insulating film is formed on the wafer surface at step 12 (CVD), electrodes are formed on the wafer by vapor deposition at step 13 (electrode formation), and ions are implanted in the wafer at step 14 (ion implantation). The wafer is coated with a photoresist at step 15 (resist treatment) and the circuit pattern is transferred to the wafer by the above-described exposure apparatus at step 16 (exposure). Control of the exposure apparatus at this time is as set forth above. This control makes the focus measurement point and the offset measurement point agree in highly precise fashion at the time of exposure. The exposed wafer is developed at step 17 (development). Portions other than the developed photoresist image are etched away at step 18 (etching), and unnecessary resist left after etching is performed is removed at step 19 (resist removal). Multiple circuit patterns are formed on the wafer by implementing these steps repeatedly.

Thus, in accordance with the present invention, a focus measurement point and an offset measurement point can be made to agree in a highly precise manner.

As many apparently widely different embodiments of the present invention can be made without departing from the spirit and scope thereof, it is to be understood that the invention is not limited to the specific embodiments thereof except as defined in the appended claims.

What is claimed is:

1. An exposure apparatus comprising:
   a stage which moves with an object thereon; and
   a surface position detector arranged to detect a surface position of the object at a timing that is asynchronous to a reference signal, which is for controlling said stage.

2. An apparatus according to claim 1, further comprising a position control system arranged to control the position of said stage.

3. An apparatus according to claim 2, wherein said position control system controls the position of said stage along the horizontal direction.

4. An apparatus according to claim 1, wherein said surface position detector includes:
- a light source, light from said light source impinging upon the surface of the object; and
- a storage-type sensor arranged to receive reflected light from the surface of the object,
- wherein height and inclination of the surface of the object are detected based upon an output signal from said storage-type sensor.

5. An apparatus according to claim 1, further comprising a horizontal position detector arranged to detect the horizontal position of the object on said stage, and to provide timing of a detection operation performed by said surface position detector.

6. An apparatus according to claim 5, wherein said horizontal position detector includes an interferometer.

7. An apparatus according to claim 1, further comprising a horizontal position calculation unit arranged to calculate the horizontal position of the object on said stage, and to provide timing of a detection operation performed by said surface position detector.

8. An apparatus according to claim 5, wherein said horizontal position calculation unit calculates the horizontal position of the object on said stage by measuring time.

9. An apparatus according to claim 1, further comprising a controller, arranged to control said surface position detector so that said surface position detector detects the surface position of the object, while said stage is being moved, prior to an exposure operation, and to control the exposure operation based upon a result of a detection of the surface position.

10. An apparatus according to claim 1, further comprising:
- a calculation unit, arranged to control said surface position detector so that said surface position detector detects the surface position of the object, while said stage is being moved, prior to an exposure operation, and to calculate focus correction data based upon a result of a detection of the surface position; and
- a focus controller arranged to control said surface position detector so that said surface position detector detects the surface position of the object, while said stage is being moved, when exposure is performed, and to apply a focus correction based upon a result of a detection of the surface position and the focus correction data.

11. An apparatus according to claim 1, wherein said exposure apparatus is a scanning exposure apparatus.

12. A method of controlling an exposure apparatus, said method comprising:
- a surface position detecting step of detecting a surface position of an object, which has been placed on a stage so as to be moved thereby, at a timing that is asynchronous to a reference signal, which is for controlling the stage.

13. A method according to claim 12, wherein said surface position detecting step includes the steps of:
- impinging light upon the surface of the object;
- receiving reflected light from the surface of the object by using a storage-type sensor; and
- detecting height and inclination of the surface of the object based upon an output signal from the storage-type sensor.

14. A method according to claim 12, further comprising a horizontal position detecting step of detecting the horizontal position of the object on the stage and providing timing of a detection operation performed in said surface position detecting step.

15. A method according to claim 14, wherein said horizontal position detection step includes detecting the horizontal position of the object on the moving stage utilizing an interferometer.

16. A method according to claim 12, further comprising a horizontal position calculating step of calculating the horizontal position of the object on the moving stage and providing timing of a detection operation performed in said surface position detecting step.

17. A method according to claim 16, wherein said horizontal position calculating step includes a step of calculating the horizontal position of the object on the stage by measuring time.

18. A method according to claim 12, further comprising a control step of causing said surface position detecting step to be performed, while the stage is being moved, prior to an exposure operation, and controlling the exposure operation based upon a result of a detection of the surface position.

19. A method according to claim 12, further comprising:
- a calculating step of causing said surface position detecting step to be performed, while the stage is being moved, prior to an exposure operation, and calculating focus correction data based upon a result of a detection of the surface position; and
- a focus step of causing said surface position detecting step to be performed, while the stage is being moved, when exposure is performed, and applying a focus correction based upon a result of a detection of the surface position and the focus correction data.

20. A method according to claim 12, wherein the exposure apparatus is a scanning exposure apparatus.

21. A device manufacturing method comprising:
- a coating step of coating an object with a photosensitive material;
- an exposure step of printing a pattern onto the object, which has been coated with the photosensitive material, utilizing an exposure apparatus as set forth in claim 1; and
- a developing step of developing the object on which the pattern has been printed.

22. An exposure apparatus comprising:
- a projection optical system which projects a pattern to an object;
- a stage system which moves the object; and
- a position detection system which detects a position of a surface of the object in a direction of an optical axis of said projection optical system, with respect to each predetermined position of the object moved by said stage system.

23. An exposure apparatus according to claim 22, wherein a detection cycle of said detection system is reset with respect to each of the predetermined positions of the object.

24. An exposure apparatus according to claim 22, further comprising a system which detects each of the predetermined positions of the object.

25. An exposure apparatus according to claim 22, wherein said position detection system recognizes each of the predetermined positions of the object based on information of a velocity of the object.

26. A device manufacturing method comprising:
- a step of exposing an object to a pattern using an exposure apparatus defined in claim 22.

27. An exposure apparatus for projecting a pattern to an object through a projection optical system, said apparatus comprising:

a stage system which moves the object; and a position detection system which detects a position of a surface of the object in a direction of an optical axis of said projection optical system, wherein while the object is moved in a direction perpendicular to the optical axis by said stage system, said position detection system detects a position of the surface with respect to each predetermined position of the object being moved by said stage system.

28. An exposure apparatus according to claim 27, wherein a detection cycle of said detection system is reset with respect to each of the predetermined positions of the object.

29. An exposure apparatus according to claim 27, further comprising a system which detects each of the predetermined positions of the object.

30. An exposure apparatus according to claim 27, wherein said position detection system recognizes each of the predetermined positions of the object based on information of a velocity of the object.

31. A device manufacturing method comprising:

a step of exposing an object to a pattern using an exposure apparatus defined in claim 27.

32. An exposure method of projecting a pattern to an object through a projection optical system, said method comprising steps of:

moving the object by a stage which supports the object; and detecting a position of a surface of the object in a direction of an optical axis of the projection optical system, with respect to each predetermined position of the object being moved by the stage.

33. An exposure method of projecting a pattern to an object through a projection optical system, said method comprising steps of:

moving the object by a stage which supports the object; and detecting a position of a surface of the object in a direction of an optical axis of the projection optical system, wherein, in said detecting step, while the object is moved in a direction perpendicular to the optical axis by the stage, a position of the surface is detected with respect to each predetermined position of the object being moved by the stage.

* * * * *